United States Patent
Zhao et al.

(10) Patent No.: US 11,629,431 B2
(45) Date of Patent: Apr. 18, 2023

(54) P-TYPE SNSE CRYSTAL CAPABLE OF BEING USED AS THERMOELECTRIC REFRIGERATION MATERIAL AND PREPARATION METHOD THEREOF

(71) Applicant: Beihang University, Beijing (CN)

(72) Inventors: Lidong Zhao, Beijing (CN); Bingchao Qin, Beijing (CN); Xiao Zhang, Beijing (CN)

(73) Assignee: BEIHANG UNIVERSITY, Beijing (CN)

( * ) Notice: Subject to any disclaimer, the term of this patent is extended or adjusted under 35 U.S.C. 154(b) by 0 days.

(21) Appl. No.: 17/551,265

(22) Filed: Dec. 15, 2021

(65) Prior Publication Data

US 2022/0389613 A1    Dec. 8, 2022

(30) Foreign Application Priority Data

Jun. 4, 2021   (CN) .......................... 202110622513.6

(51) Int. Cl.
*C30B 9/04*    (2006.01)
*C30B 29/46*   (2006.01)
*C09K 5/14*    (2006.01)

(52) U.S. Cl.
CPC .............. *C30B 29/46* (2013.01); *C09K 5/14* (2013.01); *C30B 9/04* (2013.01)

(58) Field of Classification Search
CPC .............. C30B 29/46; C30B 9/04; C09K 5/14
See application file for complete search history.

(56) References Cited

U.S. PATENT DOCUMENTS

2016/0049568 A1* 2/2016 Kanatzidis ............ C01B 19/007
                                                  320/101
2018/0033937 A1* 2/2018 Yu .......................... H01L 35/30

FOREIGN PATENT DOCUMENTS

KR    20200079797    *  7/2020

OTHER PUBLICATIONS

Peng et al. "broad temperature plateau for hig ZT in heavely doped p-type SnSe single crystals" Energy Enivormental Science vol. 9 2016 para 454-460.*

* cited by examiner

*Primary Examiner* — Robert M Kunemund
(74) *Attorney, Agent, or Firm* — McClure, Qualey & Rodack, LLP (57) ABSTRACT

The present disclosure relates to P-type SnSe crystal capable of being used as thermoelectric refrigeration material and a preparation method thereof. The material is a Na-doped and Pb-alloyed SnSe crystal. A molar ratio of Sn, Se, Pb and Na is (1-x-y):1:y:x, where $0.015 \leq x \leq 0.025$ and $0.05 \leq y \leq 0.11$. The P-type SnSe crystal provided by the present disclosure is capable of being used as the thermoelectric refrigeration material. A power factor PF of the P-type SnSe crystal at a room temperature is $\geq 70$ $\mu Wcm^{-1}K^{-2}$, and ZT at the room temperature is $\geq 1.2$. A single-leg temperature difference measurement platform built on the basis of the obtained SnSe crystal may realize a refrigeration temperature difference of 17.6 K at a current of 2 A. The present disclosure adopts a modified directional solidification method and uses a continuous temperature region for slow cooling to grow a crystal to obtain the large-sized high-quality SnSe crystal.

16 Claims, 6 Drawing Sheets

P-TYPE SNSE CRYSTAL CAPABLE OF BEING USED AS THERMOELECTRIC REFRIGERATION MATERIAL AND PREPARATION METHOD THEREOF

FIELD

The present disclosure relates to the technical field of semiconductor material, in particular to P-type SnSe crystal capable of being used as thermoelectric refrigeration material and a preparation method thereof.

BACKGROUND

Thermoelectric material belongs to a kind of new energy material that may realize mutual reversible conversion of electric energy and heat energy. In recent years, the thermoelectric material has drawn more and more research attention in the fields of industrial waste heat recovery, automobile exhaust waste heat utilization, micro precision temperature control, electronic refrigeration, aerospace and so on. The energy conversion efficiency of the thermoelectric material and power generation and refrigeration devices assembled thereby is determined by the dimensionless figure of merit, that is, ZT of the material. Within a certain temperature range, the higher the ZT and an average ZT, the better the thermoelectric performance of the material and the higher corresponding energy conversion efficiency. Therefore, the focus of research in the thermoelectric field is to research and develop more efficient thermoelectric material systems and realize more reasonable thermoelectric material device assembly methods.

Thermoelectric refrigeration is a novel electronic refrigeration manner. Due to the advantages of being free of noise, mechanical vibration and consumption of material and devices, accurate in control over refrigeration temperature by electric current in the refrigeration process, thermoelectric refrigeration has irreplaceable key applications in the fields of heat dissipation and refrigeration of semiconductors and electronic devices, and precise temperature control of micro devices and micro regions. Nowadays, the only commercially available thermoelectric refrigeration material is bismuth telluride, which has excellent thermoelectric performance and ZT of about 1.0 at room temperature as well as in a certain temperature range below the room temperature. However, bismuth telluride thermoelectric refrigeration material has the disadvantages of containing a poisonous element (Te) and a micro-radioactive element (Bi), and having scarce reserves in the earth's crust, high price, high density, etc., which also limit the scope of its practical applications to a certain extent.

SnSe crystal, as a novel thermoelectric material that is environmentally friendly, earth abundant in reserves, low in price, and lighter in mass, has realized continuous development and improvement in its thermoelectric performance in the past few years. In P-type SnSe crystal, through combination of doping to optimize the carrier concentration with a certain control strategy, ZT of 0.7-0.8 around the room temperature can be obtained, which preliminarily shows its potential of being used as thermoelectric refrigeration material. However, in order to truly realize the practical application effect of replacing commercial bismuth telluride in thermoelectric devices, in addition to further optimization strategies to make the ZT at the room temperature of the P-type SnSe crystal exceed 1.0, it is also necessary to grow and prepare bulk crystals for use in device assembly.

Based on optimization of Na doping nowadays, the thermoelectric performance of the P-type SnSe crystal still has disadvantages such as insufficient room temperature performance and large space for performance optimization.

SUMMARY

In view of the above technical problems in the prior art, the present disclosure provides P-type SnSe crystal capable of being used as thermoelectric refrigeration material and a preparation method thereof, which can be used in fields of industrial waste heat recovery, automobile exhaust waste heat utilization, micro-precision temperature control, electronics refrigeration, aerospace, etc. The present disclosure overcomes the disadvantages of insufficient room temperature performance and large space for performance optimization of thermoelectric performance of P-type SnSe crystal by regulating and controlling the energy band structure and promoting interactions of multiple valence bands, realizes excellent thermoelectric performance, ensures the application as the thermoelectric refrigeration material, and has the advantages of being environmentally friendly, low in price, and light in mass.

Specifically, the following technical solution is mainly used for implementation:

In a first aspect, the present disclosure provides P-type SnSe crystal capable of being used as thermoelectric refrigeration material. The crystal is a Na-doped and Pb-alloyed SnSe crystal. A molar ratio of Sn, Se, Pb and Na is (1-x-y):1:y:x, where: $0.015 \leq x \leq 0.025$ and $0.05 \leq y \leq 0.11$.

Preferably, $0.018 \leq x \leq 0.022$ and $0.07 \leq y \leq 0.09$.

In a second aspect, a preparation method of P-type SnSe crystal capable of being used as thermoelectric refrigeration material is further provided, including:

step 1, mixing Sn, Se, Pb and Na according to a molar ratio of (1-x-y):1:y:x to obtain a mixture, where: $0.015 \leq x \leq 0.025$ and $0.05 \leq y \leq 0.11$;

step 2, performing a high-temperature melting synthesis reaction on the mixture; and step 3, cooling and growing the composition subjected to the reaction in step 2 to obtain the P-type SnSe crystal, wherein the crystal is capable of being used as the thermoelectric refrigeration material.

Preferably, step 2 specifically includes:

placing the mixture in a quartz tube, and performing vacuumizing treatment, wherein a vacuum degree is less than or equal to $1 \times 10^{-3}$ Pa; and vertically placing the quartz tube containing the mixture into a high-temperature furnace for the high-temperature melting synthesis reaction.

Preferably, conditions of the high-temperature melting synthesis reaction include: first increasing a temperature of the high-temperature furnace to 1050-1100° C. at a rate of 50-100° C./h, and maintaining the temperature for 1000-1500 min for the high-temperature melting synthesis reaction.

Preferably, the quartz tube is of a double-layer structure, and includes an inner quartz tube configured to contain the mixture and an outer quartz tube, the inner quartz tube is a tapered-bottomed quartz tube with a tube wall thickness of not less than 1 mm, and the outer quartz tube is a flat-bottomed quartz tube with a tube wall thickness of not less than 1.5 mm.

Preferably, an angle θ of a bottom taper of the inner quartz tube is $15° \leq \theta/2 \leq 25°$.

Preferably, a diameter difference between an inner wall diameter of the outer quartz tube and an outer wall diameter of the inner quartz tube is not less than 5 mm.

Preferably, a distance between a heating thermocouple of the high-temperature furnace and a bottom of the inner quartz tube is 9-11 cm.

Preferably, an inner wall of the inner quartz tube is coated with a carbon layer for protection, and a thickness of the carbon layer is not less than 0.1 mm.

Preferably, step 3 specifically includes:

decreasing the temperature of the high-temperature furnace to 650-700° C. at a rate of 0.5-1° C./h for crystal growth; and then decreasing the temperature of the high-temperature furnace to 20-30° C. at a rate of 20-50° C./h to obtain the P-type SnSe crystal capable of being used as the thermoelectric refrigeration material.

Compared with the prior art, the present disclosure has the following beneficial effects:

The P-type SnSe crystal provided by the present disclosure is capable of being used as the thermoelectric refrigeration material. Especially at room temperature, Pb alloying can effectively promote the multiple valence band synergistic effect of the SnSe material, and collaboratively optimize the carrier mobility and effective mass of the material, so a higher power factor and higher ZT are realized, and the disadvantages of insufficient room temperature performance and large space for performance optimization of thermoelectric performance of an existing P-type SnSe crystal are overcome. The preparation method of the P-type SnSe crystal thermoelectric refrigeration material provided by the present disclosure adopts a modified directional solidification method and uses a continuous temperature region for slow cooling to grow a crystal to obtain the large-size and high-quality SnSe crystal, which has excellent thermoelectric performance within the whole temperature range, and realizes good thermoelectric refrigeration performance in the novel SnSe crystal material that is non-toxic, low in price, environmentally friendly, and light in mass.

DETAILED DESCRIPTION OF THE EMBODIMENTS

In order that those skilled in the art may more clearly understand the core idea of the present disclosure, a detailed description thereof will be made with reference to the accompanying drawings.

The present disclosure provides P-type SnSe crystal capable of being used as thermoelectric refrigeration material. The crystal is a Na-doped and Pb-alloyed SnSe crystal. A molar ratio of Sn, Se, Pb and Na is (1-x-y):1:y:x, where $0.015 \leq x \leq 0.025$ and $0.05 \leq y \leq 0.11$.

In a preferable embodiment, $0.018 \leq x \leq 0.022$ and $0.07 \leq y \leq 0.09$.

Figure 1:
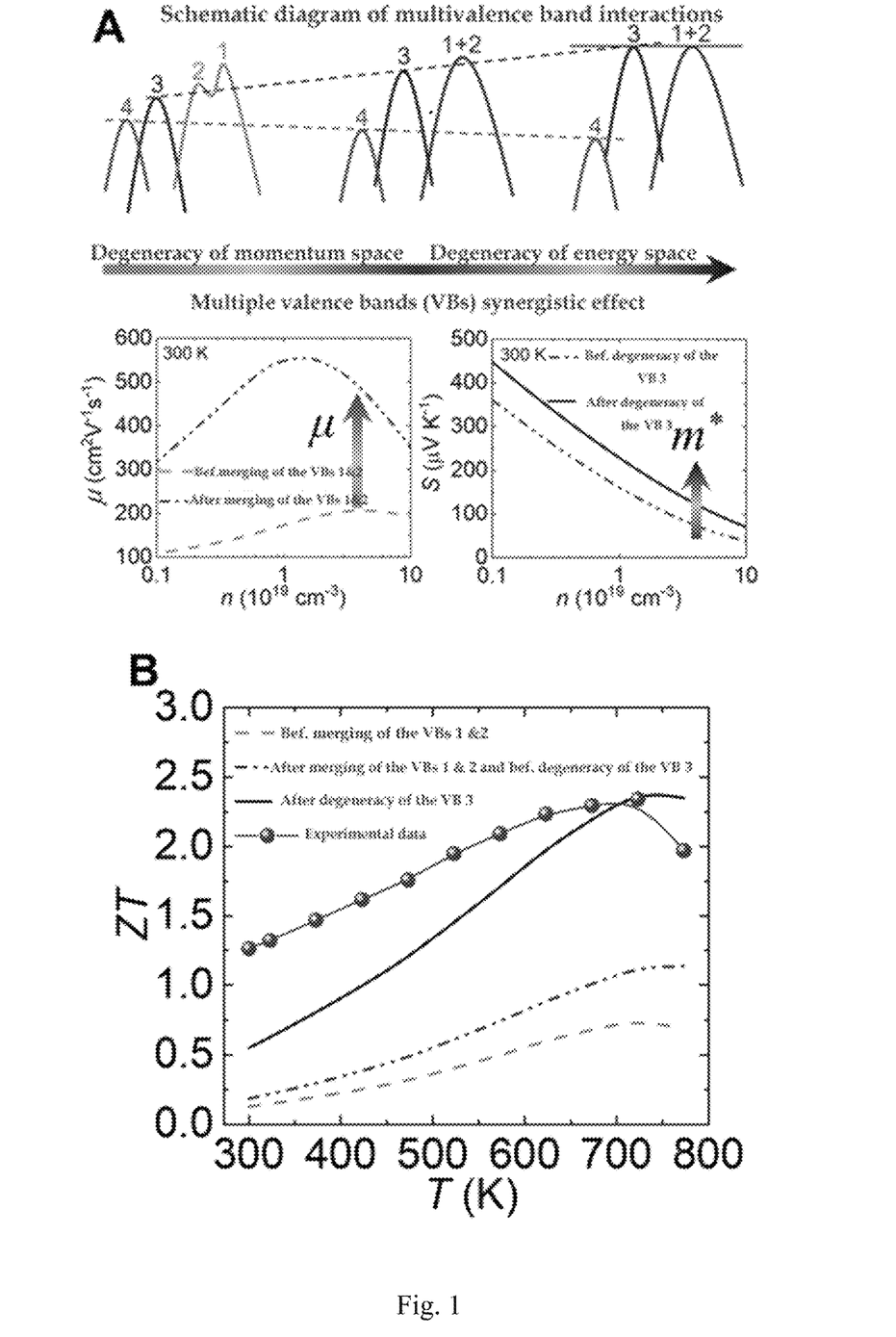
FIG. 1 is a schematic diagram of promoting the multiple valence band synergistic effect of P-type SnSe crystal and optimizing thermoelectric transmission parameters (carrier mobility $\mu$, Seebeck coefficient S, effective mass m* and thermoelectric figure of merit ZT) through Pb alloying provided by an embodiment of the present disclosure.

In the present disclosure, solid solution of Pb may effectively promote the multiple valence band synergistic effect of the SnSe crystal material, and collaboratively optimize the carrier mobility and effective mass of the material, thereby achieving a higher power factor and higher ZT, especially at room temperature namely low temperature range. Specifically, as shown in FIG. 1: by solid solution of a certain amount of Pb into the SnSe material, the degeneracy of valence bands in momentum space can be achieved first, which is specifically manifested as the merging process of the valence band 1 and valence band 2 into one valence band (indicated as valence band 1+2 in the figure). This process is considered to be derived from the improvement of the crystal symmetry of the material, which will cause the carrier mobility ($\mu$) to be greatly increased. Secondly, Pb solid solution may further realize the degeneracy of the valence bands in energy space, which is specifically manifested in an energy band alignment effect between the valence band 3 and the merged valence band 1+2. This process significantly improves the effective mass (m*) and Seebeck coefficient (S) of the material. Synergistic effects of the multiple valence bands in the momentum space and energy space are combined, so the power factor (PF) of the material is significantly improved, and higher ZT may be predicted from the perspective of theoretical calculations, as shown by the line curves in FIG. 1B, and concrete verification is finally realized experimentally. The above analysis shows that the present disclosure optimizes the hole carrier concentration, and realizes substantial improvement in the thermoelectric performance of the P-type SnSe crystal. Especially near room temperature, the ZT of the P-type SnSe crystal exceeds the expected target of 1.0, which indicates the great potential of the P-type SnSe crystal in the embodiment of the present disclosure as a novel thermoelectric refrigeration material.

Figure 3:
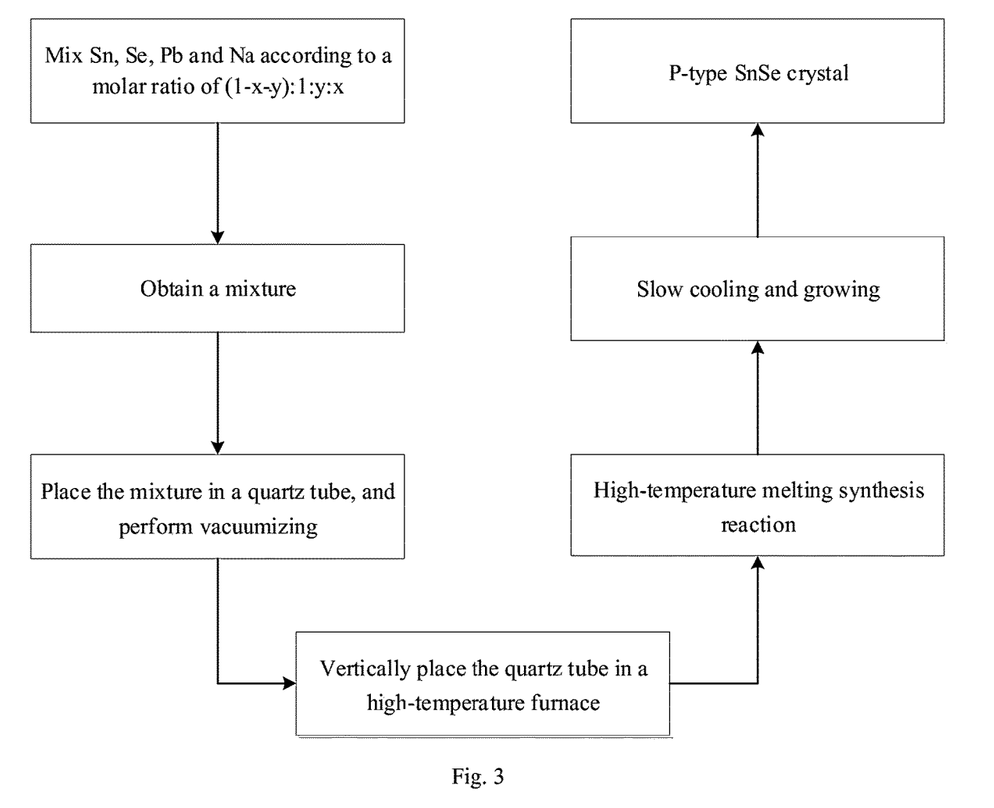
FIG. 3 is a schematic flowchart of the preparation method of the P-type SnSe crystal capable of being used as thermoelectric refrigeration material provided by an embodiment of the present disclosure.

The present disclosure further provides a preparation method of P-type SnSe crystal capable of being used as thermoelectric refrigeration material. As shown in FIG. 3, the method includes the following preparation steps:

step 1, Sn, Se, Pb and Na are mixed according to a molar ratio of (1-x-y):1:y:x to obtain a mixture, where $0.015 \leq x \leq 0.025$ and $0.05 \leq y \leq 0.11$;

step 2, a high-temperature melting synthesis reaction is performed on the mixture; and step 3, cooling and growing are performed on the composition subjected to the reaction in step 2 to obtain the P-type SnSe crystal capable of being used as the thermoelectric refrigeration material.

In a preferable embodiment, the purity of Sn, Se, Pb and Na is $\geq 99.95\%$.

In a preferable embodiment, step 2 specifically includes:

the mixture is placed in a quartz tube, and subjected to vacuumizing treatment, and the vacuum degree is less than or equal to $1 \times 10^{-3}$ Pa; and the quartz tube containing the mixture is vertically placed in a high-temperature furnace for the high-temperature melting synthesis reaction.

In a preferable embodiment, the vacuum degree is less than or equal to $5 \times 10^{-4}$ Pa.

In a preferable embodiment, conditions of the high-temperature melting synthesis reaction include: a temperature of the high-temperature furnace is first increased to 1050-1100° C. at a rate of 50-100° C./h, and the temperature is maintained for 1000-1500 min for the high-temperature melting synthesis reaction.

In a preferable embodiment, the conditions of the high-temperature melting synthesis reaction include: a temperature of the high-temperature furnace is first increased to 1060-1090° C. at a rate of 60-90° C./h, and the temperature is maintained for 1200-1300 min for the high-temperature melting synthesis reaction.

In a preferable embodiment, the quartz tube is of a double-layer structure, and includes an inner quartz tube configured to contain the mixture and an outer quartz tube. The inner quartz tube is a tapered-bottomed quartz tube with a tube wall thickness of not less than 1 mm and a height of 10-12 cm. The outer quartz tube is a flat-bottomed quartz tube with a tube wall thickness of not less than 1.5 mm and a height of 15-20 cm. A tapered bottom of the inner quartz tube helps a molten raw material to easily form a seed crystal in the slow cooling process, and enables the subsequent molten raw material to continuously grow along the preferred orientation of the seed crystal in the slow cooling process, and finally a bulk crystal sample may be obtained.

In a preferable embodiment, an angle θ of a bottom taper of the inner quartz tube is $15° \leq \theta/2 \leq 25°$.

In a preferable embodiment, the angle θ of the bottom taper of the inner quartz tube is $18° \leq \theta/2 \leq 22°$.

In a preferable embodiment, the tube wall thickness of the inner quartz tube is not less than 1.2 mm.

In a preferable embodiment, the tube wall thickness of the outer quartz tube is preferably not less than 1.8 mm.

In a preferable embodiment, a diameter difference between an inner wall diameter of the outer quartz tube and an outer wall diameter of the inner quartz tube is not less than 5 mm.

In a preferable embodiment, the diameter difference between the inner wall diameter of the outer quartz tube and the outer wall diameter of the inner quartz tube is not less than 8 mm.

The conditions of the wall thickness and diameter of the double-layer quartz tube may better protect the sample against oxidation in the high-temperature melting synthesis and crystal growth of the sample, so as to ensure that the tube wall may not be damaged, for example, being cracked, due to the sudden change in the volume caused by the phase transition process of the material in the cooling process.

In a preferable embodiment, an inner wall of the inner quartz tube is coated with a carbon layer for protection, and a thickness of the carbon layer is not less than 0.1 mm.

In a preferable embodiment, an inner wall of the inner quartz tube is coated with a carbon layer for protection, and a thickness of the carbon layer is not less than 0.15 mm.

The carbon layer may effectively avoid the direct contact of Na with the inner wall of the quartz tube to cause a chemical reaction. The carbon layer is preferably obtained by a high-temperature pyrolysis carbon vapor deposition method. The present disclosure does not have any special restrictions on deposition conditions, and deposition conditions well known to those skilled in the art may be used.

In a preferable embodiment, a distance between a heating thermocouple of the high-temperature furnace and the bottom of the inner quartz tube is 9-11 cm.

In a preferable embodiment, in the preparation process of an improved continuous temperature region directional solidification method, the double-layer quartz tube containing the mixture is placed vertically, and the distance between the bottom of the inner quartz tube and the heating thermocouple of the vertical high-temperature furnace is 9.5-10.5 cm.

In a preferable embodiment, step 3 specifically includes:

the temperature of the high-temperature furnace is slowly decreased to 650-700° C. at a rate of 0.5-1° C./h for crystal growth; and then the temperature of the high-temperature furnace is decreased to 20-30° C. at a rate of 20-50° C./h to obtain the P-type SnSe crystal capable of being used as the thermoelectric refrigeration material.

In a preferable embodiment, the temperature of the high-temperature furnace is slowly decreased to 660-690° C. at a rate of 0.6-0.9° C./h for crystal growth; and then the temperature of the high-temperature furnace is decreased to 20-30° C. at a rate of 30-40° C./h to obtain the P-type SnSe crystal capable of being used as the thermoelectric refrigeration material.

The above heating and maintaining processes may synthesize a SnSe material in a molten state, and the slow cooling process may grow the high-quality bulk SnSe crystal. By controlling the heating rate and the maintaining time, elements in raw material may be fully subjected to the melting reaction, and grow into the bulk crystal in a certain direction.

In a preferable embodiment, the vacuum degree of the inner tapered-bottomed quartz tube and the vacuum degree of the outer flat-bottomed quartz tube are obtained by cyclic vacuumizing and filling with inert gas. The number of cycles is 3-4. The vacuum degree condition may prevent the raw material from being oxidized in the preparation and growth processes of the crystal.

It should be noted that in the present disclosure, weighing of the raw material and the material mixing process are preferably performed under an inert atmosphere. The present disclosure does not have any special restrictions on the gas type of the inert atmosphere, and an inert atmosphere well known to those skilled in the art may be used, for example, an inert atmosphere composed of gases such as helium (He), neon (Ne), argon (Ar), krypton (Kr), or xenon (Xe). In the present disclosure, the inert atmosphere may prevent Na from being oxidized. It can be understood that the embodiments of the present disclosure do not have any special restrictions on the manner of mixing material, and a mixing manner well known to those skilled in the art may be used.

The present disclosure does not have any special restrictions on the vacuum and sealing treatment of the quartz tube, and a sealing process well known to those skilled in the art may be used for sealing, for example, a hydrogen-oxygen flame is configured to seal the quartz tube.

Figure 4:
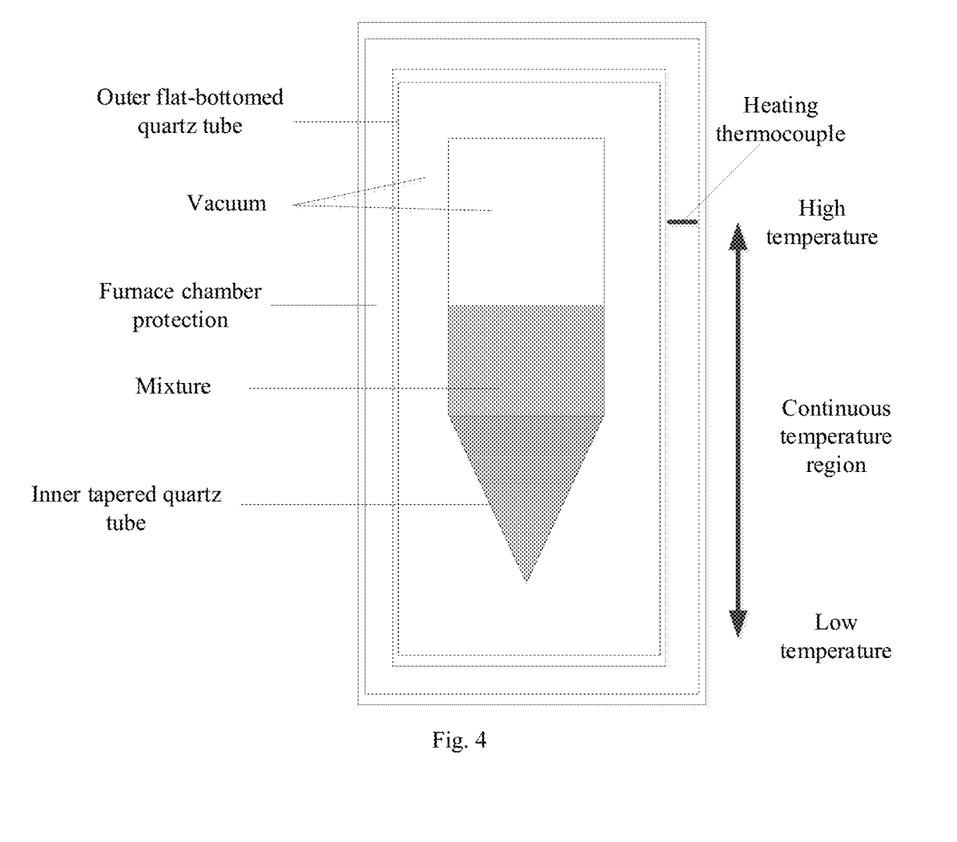
FIG. 4 is a schematic structural diagram of the furnace chamber apparatus and a double-layer quartz tube that adopt a vertical continuous temperature region with modified directional solidification method to grow a crystal provided by an embodiment of the present disclosure.

In summary, the present disclosure discloses the preparation method of the P-type SnSe crystal capable of being used as the thermoelectric refrigeration material, and specifically discloses: Sn, Se, Pb and Na are weighed and mixed in the molar ratio of $(1-x-y):1:y:x$ to obtain the mixture, where $0.015 \leq x \leq 0.025$ and $0.05 \leq y \leq 0.11$, high-temperature melting synthesis is performed on the mixture, and the crystal is slowly cooled and grown to obtain the P-type SnSe crystal that is capable of being used as the thermoelectric refrigeration material. The preparation process of high-temperature synthesis is performed in a continuous temperature region, and is an improved directional solidification method. The double-layer quartz tube and a protective furnace chamber for crystal growth are as shown in FIG. 4. In the preparation process of the modified continuous temperature region directional solidification method, the double-layer quartz tube containing the mixture is placed vertically, and the distance between the bottom of the inner quartz tube and the heating thermocouple of the vertical high-temperature furnace is 9-11 cm. A continuous linear temperature interval is formed in the double-layer quartz tube containing the mixture in the vertical high-temperature furnace. The temperature of the continuous temperature interval changes with a height position. A temperature difference of 90-110° C. is produced in the height position range of 9-11 cm between the heating thermocouple of the vertical high-temperature furnace and the bottom of the inner quartz tube, or a temperature difference of 95-105° C. is produced in the height position range of 9.5-10.5 cm between the heating thermocouple of the vertical high-temperature furnace and the bottom of the inner quartz tube. The farther away from the heating thermocouple, the lower the corresponding temperature.

Figure 2:
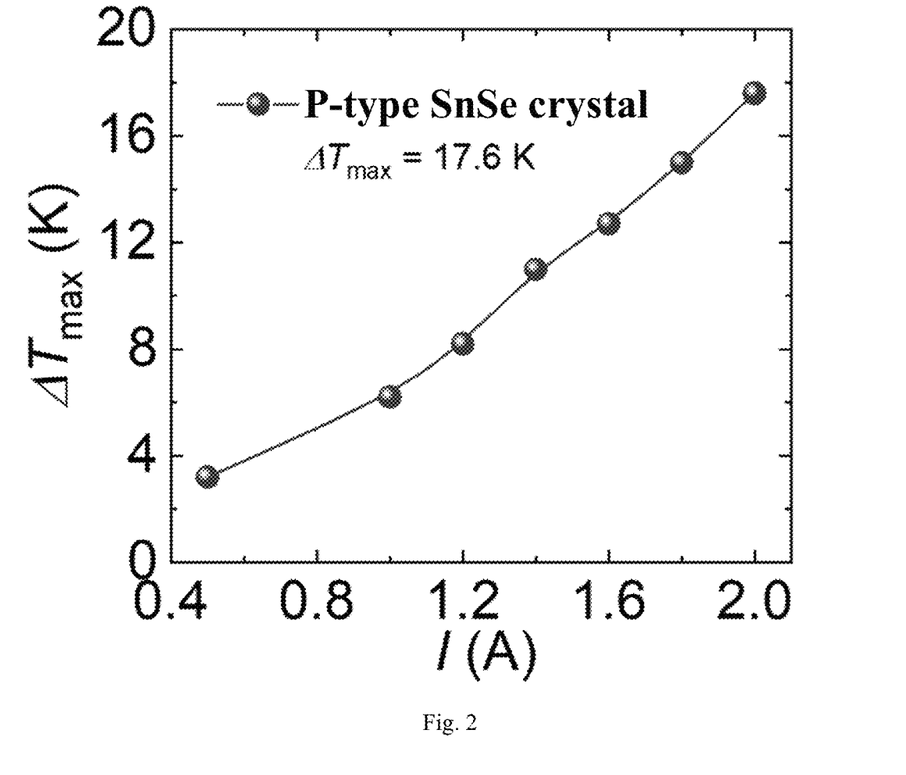
FIG. 2 is the measurement result data curve showing changes of the maximum refrigeration temperature difference ($\Delta$Tmax) of a single-leg measured by a single-leg refrigeration temperature difference measurement platform built on the basis of the P-type SnSe crystal with input current (I/A) provided by an embodiment of the present disclosure.

The P-type SnSe crystal prepared above is capable of being used as the thermoelectric refrigeration material, and has excellent thermoelectric performance, and especially at room temperature and low temperature range, it shows its potential as the thermoelectric refrigeration material. Based on the obtained P-type SnSe crystal, a built single-leg refrigeration temperature difference device realizes a certain refrigeration temperature difference effect. Specifically, at room temperature, the power factor PF of the P-type SnSe crystal of the present disclosure is $\geq 70\ \mu Wcm^{-1}K^{-2}$, and the ZT at the room temperature is $\geq 1.2$. As shown in FIG. 2, a single-leg temperature difference measurement platform built based on the P-type SnSe crystal can realize a refrigeration temperature difference of 17.6 K at a current of 2 A. This shows important applications of the P-type SnSe crystal obtained in the present disclosure in the fields of semiconductor electronic refrigeration, precise temperature control of micro-devices and the P-type SnSe crystal as the novel thermoelectric refrigeration material is environmentally friendly, low in cost, and light in mass.

The novel P-type SnSe crystal capable of being used as the thermoelectric refrigeration material and the preparation method and applications thereof provided by the present disclosure will be described in detail below with reference to specific embodiments and the accompanying drawings, but are not to be construed as limiting the scope of the present disclosure.

Embodiment 1

According to a molar ratio of Sn, Se, Pb and Na of 0.93:1:0.05:0.02, blocks of Sn, Se, Pb and Na with the purity greater than 99.95% are weighed and mixed in a glove box with an inert gas of nitrogen to obtain a mixture. The mixture is placed into an inner tapered-bottomed quartz tube (with the height of 12 cm, the inner diameter of 12 mm, the tube wall thickness of 1.2 mm, and the thickness of a carbon layer on an inner wall of 0.14 mm), vacuumizing is performed until the vacuum degree is less than $1 \times 10^{-3}$ Pa, argon gas is injected, the operation circulates 3 times, then vacuumizing is performed until the vacuum degree is less than $1 \times 10^{-3}$ Pa, and the quartz tube with a tapered bottom is sealed with a flame. The sealed inner quartz tube with the tapered bottom is placed in an outer flat-bottomed quartz tube with the inner diameter of 25 mm (with the tube wall thickness of 1.8 mm), vacuumizing is performed until the vacuum degree is less than $1 \times 10^{-3}$ Pa, argon gas is injected, the operation circulates 3 times, then vacuumizing is performed until the vacuum degree is less than $1 \times 10^{-3}$ Pa, and the outer flat-bottomed quartz tube is sealed with a flame, so that a double-layer quartz tube containing the mixture is obtained. The double-layer quartz tube is placed in an improved vertical tube furnace, and a distance between the bottom of the inner tapered-bottomed quartz tube and a heating thermocouple of the vertical tube furnace is 10.5 cm. A temperature control program of the heating thermocouple of the vertical tube furnace is set as: first heating to 1060° C. at a rate of 50° C./h, and maintaining for 1200 min; and then cooling to 700° C. at a rate of 1° C./h, and then cooling to 30° C. at a rate of 40° C./h. Finally, P-type SnSe crystal capable of being used as thermoelectric refrigeration material is obtained.

The obtained SnSe crystal is cut and polished into specific shapes for subsequent measurements and characterizations of thermoelectric performance parameters and assembly testing of single-leg and multi-pair thermoelectric refrigeration devices.

Embodiment 2

According to a molar ratio of Sn, Se, Pb and Na of 0.91:1:0.07:0.02, blocks of Sn, Se, Pb and Na with the purity greater than 99.95% are weighed and mixed in a glove box with an inert gas of nitrogen to obtain a mixture. The mixture is placed into an inner tapered-bottomed quartz tube (with a height of 11 cm, an inner diameter of 12.5 mm, a tube wall thickness of 1.2 mm, and a thickness of a carbon layer on an inner wall of 0.16 mm), vacuumizing is performed until the vacuum degree is less than $8 \times 10^{-4}$ Pa, argon gas is injected, the operation circulates 4 times, then vacuumizing is performed until the vacuum degree is less than $8 \times 10^{-4}$ Pa, and the quartz tube with a tapered bottom is sealed with a flame. The sealed inner quartz tube with the tapered bottom is placed in an outer flat-bottomed quartz tube with the inner diameter of 26 mm (with the tube wall thickness of 2 mm), vacuumizing is performed until the vacuum degree is less than $1 \times 10^{-3}$ Pa, argon gas is injected, the operation circulates 3 times, then vacuumizing is performed until the vacuum degree is less than $1 \times 10^{-3}$ Pa, and the outer flat-bottomed quartz tube is sealed with a flame, so that a double-layer quartz tube containing the mixture is obtained.

The double-layer quartz tube is placed in an improved vertical tube furnace, and a distance between the bottom of the inner tapered-bottomed quartz tube and a heating thermocouple of the vertical tube furnace is 10 cm. A temperature control program of the heating thermocouple of the vertical tube furnace is set as: first heating to 1050° C. at a rate of 50° C./h, and maintaining for 1400 min; and then cooling to 650° C. at a rate of 0.5° C./h, and then cooling to 30° C. at a rate of 50° C./h. Finally, P-type SnSe crystal capable of being used as thermoelectric refrigeration material is obtained.

The obtained SnSe crystal is cut and polished into specific shapes for subsequent measurements and characterizations of thermoelectric performance parameters and assembly testing of single-leg and multi-pair thermoelectric refrigeration devices.

Embodiment 3

According to a molar ratio of Sn, Se, Pb and Na of 0.89:1:0.09:0.02, blocks of Sn, Se, Pb and Na with the purity greater than 99.95% are weighed and mixed in a glove box with an inert gas of nitrogen to obtain a mixture. The mixture is placed into an inner tapered-bottomed quartz tube (with a height of 12 cm, an inner diameter of 12 mm, a tube wall thickness of 1.3 mm, and a thickness of a carbon layer on an inner wall of 0.15 mm), vacuumizing is performed until the vacuum degree is less than $6\times10^{-4}$ Pa, argon gas is injected, the operation circulates 4 times, then vacuumizing is performed until the vacuum degree is less than $6\times10^{-4}$ Pa, and the quartz tube with a tapered bottom is sealed with a flame. The sealed inner quartz tube with the tapered bottom is placed in an outer flat-bottomed quartz tube with the inner diameter of 25 mm (with the tube wall thickness of 2 mm), vacuumizing is performed until the vacuum degree is less than $8\times10^{-4}$ Pa, argon gas is injected, the operation circulates 3 times, then vacuumizing is performed until the vacuum degree is less than $8\times10^{-4}$ Pa, and the outer flat-bottomed quartz tube is sealed with a flame, so that a double-layer quartz tube containing the mixture is obtained. The double-layer quartz tube is placed in an improved vertical tube furnace, and a distance between the bottom of the inner tapered-bottomed quartz tube and a heating thermocouple of the vertical tube furnace is 11 cm. A temperature control program of the heating thermocouple of the vertical tube furnace is set as: first heating to 1100° C. at a rate of 50° C./h, and maintaining for 1200 min; and then cooling to 700° C. at a rate of 0.8° C./h, and then cooling to 30° C. at a rate of 30° C./h. Finally, P-type SnSe crystal capable of being used as thermoelectric refrigeration material is obtained.

The obtained SnSe crystal is cut and polished into specific shapes for subsequent measurements and characterizations of thermoelectric performance parameters and assembly testing of single-leg and multi-pair thermoelectric refrigeration devices.

Embodiment 4

According to a molar ratio of Sn, Se, Pb and Na of 0.87:1:0.11:0.02, blocks of Sn, Se, Pb and Na with the purity greater than 99.95% are weighed and mixed in a glove box with an inert gas of nitrogen to obtain a mixture. The mixture is placed into an inner tapered-bottomed quartz tube (with a height of 12 cm, an inner diameter of 12.5 mm, a tube wall thickness of 1.5 mm, and a thickness of a carbon layer on an inner wall of 0.18 mm), vacuumizing is performed until the vacuum degree is less than $5\times10^{-4}$ Pa, argon gas is injected, the operation circulates 4 times, then vacuumizing is performed until the vacuum degree is less than $5\times10^{-4}$ Pa, and the quartz tube with a tapered bottom is sealed with a flame. The sealed inner quartz tube with the tapered bottom is placed in an outer flat-bottomed quartz tube with the inner diameter of 25 mm (with the tube wall thickness of 2 mm), vacuumizing is performed until the vacuum degree is less than $1\times10^{-3}$ Pa, argon gas is injected, the operation circulates 3 times, then vacuumizing is performed until the vacuum degree is less than $1\times10^{-3}$ Pa, and the outer flat-bottomed quartz tube is sealed with a flame, so that a double-layer quartz tube containing the mixture is obtained. The double-layer quartz tube is placed in an improved vertical tube furnace, and a distance between the bottom of the inner tapered-bottomed quartz tube and a heating thermocouple of the vertical tube furnace is 9.5 cm. A temperature control program of the heating thermocouple of the vertical tube furnace is set as: first heating to 1060° C. at a rate of 80° C./h, and maintaining for 1200 min; and then cooling to 680° C. at a rate of 0.8° C./h, and then cooling to 30° C. at a rate of 40° C./h. Finally, P-type SnSe crystal capable of being used as thermoelectric refrigeration material is obtained.

The obtained SnSe crystal is cut and polished into specific shapes for subsequent measurements and characterizations of thermoelectric performance parameters and assembly testing of single-leg and multi-pair thermoelectric refrigeration devices.

Embodiment 5

According to a molar ratio of Sn, Se, Pb and Na of 0.895:1:0.09:0.015, blocks of Sn, Se, Pb and Na with the purity greater than 99.95% are weighed and mixed in a glove box with an inert gas of nitrogen to obtain a mixture. The mixture is placed into an inner tapered-bottomed quartz tube (with a height of 11 cm, an inner diameter of 12.5 mm, a tube wall thickness of 1.2 mm, and a thickness of a carbon layer on an inner wall of 0.16 mm), vacuumizing is performed until the vacuum degree is less than $5\times10^{-4}$ Pa, argon gas is injected, the operation circulates 4 times, then vacuumizing is performed until the vacuum degree is less than $5\times10^{-4}$ Pa, and the quartz tube with a tapered bottom is sealed with a flame. The sealed inner quartz tube with the tapered bottom is placed in an outer flat-bottomed quartz tube with the inner diameter of 26 mm (with the tube wall thickness of 2 mm), vacuumizing is performed until the vacuum degree is less than $8\times10^{-4}$ Pa, argon gas is injected, the operation circulates 3 times, then vacuumizing is performed until the vacuum degree is less than $8\times10^{-4}$ Pa, and the outer flat-bottomed quartz tube is sealed with a flame, so that a double-layer quartz tube containing the mixture is obtained. The double-layer quartz tube is placed in an improved vertical tube furnace, and a distance between the bottom of the inner tapered-bottomed quartz tube and a heating thermocouple of the vertical tube furnace is 10 cm. A temperature control program of the heating thermocouple of the vertical tube furnace is set as: first heating to 1050° C. at a rate of 50° C./h, and maintaining for 1500 min; and then cooling to 650° C. at a rate of 0.5° C./h, and then cooling to 30° C. at a rate of 40° C./h. Finally, P-type SnSe crystal capable of being used as thermoelectric refrigeration material is obtained.

The obtained SnSe crystal is cut and polished into specific shapes for subsequent measurements and characterizations of thermoelectric performance parameters and assembly testing of single-leg and multi-pair thermoelectric refrigeration devices.

Embodiment 6

According to a molar ratio of Sn, Se, Pb and Na of 0.885:1:0.09:0.025, blocks of Sn, Se, Pb and Na with the purity greater than 99.95% are weighed and mixed in a glove box with an inert gas of nitrogen to obtain a mixture. The mixture is placed into an inner tapered-bottomed quartz tube (with a height of 11 cm, an inner diameter of 12.5 mm, a tube wall thickness of 1.5 mm, and a thickness of a carbon layer on an inner wall of 0.17 mm), vacuumizing is performed until the vacuum degree is less than $5\times10^{-4}$ Pa, argon gas is injected, the operation circulates 4 times, then vacuumizing is performed until the vacuum degree is less than $5\times10^{-4}$ Pa, and the quartz tube with a tapered bottom is sealed with a flame. The sealed inner quartz tube with the tapered bottom is placed in an outer flat-bottomed quartz tube with the inner diameter of 25 mm (with the tube wall thickness of 2 mm), vacuumizing is performed until the vacuum degree is less than $8\times10^{-4}$ Pa, argon gas is injected, the operation circulates 3 times, then vacuumizing is performed until the vacuum degree is less than $8\times10^{-4}$ Pa, and the outer flat-bottomed quartz tube is sealed with a flame, so that a double-layer quartz tube containing the mixture is obtained. The double-layer quartz tube is placed in an improved vertical tube furnace, and a distance between the bottom of the inner tapered-bottomed quartz tube and a heating thermocouple of the vertical tube furnace is 10.5 cm. A temperature control program of the heating thermocouple of the vertical tube furnace is set as: first heating to 1050° C. at a rate of 50° C./h, and maintaining for 1500 min; and then cooling to 650° C. at a rate of 0.5° C./h, and then cooling to 30° C. at a rate of 40° C./h. Finally, P-type SnSe crystal capable of being used as thermoelectric refrigeration material is obtained.

The obtained SnSe crystal is cut and polished into specific shapes for subsequent measurements and characterizations of thermoelectric performance parameters and assembly testing of single-leg and multi-pair thermoelectric refrigeration devices.

Embodiment 7

According to a molar ratio of Sn, Se, Pb and Na of 0.892:1:0.09:0.018, blocks of Sn, Se, Pb and Na with the purity greater than 99.95% are weighed and mixed in a glove box with an inert gas of nitrogen to obtain a mixture. The mixture is placed into an inner tapered-bottomed quartz tube (with a height of 12 cm, an inner diameter of 12.5 mm, a tube wall thickness of 1.3 mm, and a thickness of a carbon layer on an inner wall of 0.16 mm), vacuumizing is performed until the vacuum degree is less than $5\times10^{-4}$ Pa, argon gas is injected, the operation circulates 4 times, then vacuumizing is performed until the vacuum degree is less than $5\times10^{-4}$ Pa, and the quartz tube with a tapered bottom is sealed with a flame. The sealed inner quartz tube with the tapered bottom is placed in an outer flat-bottomed quartz tube with the inner diameter of 25 mm (with the tube wall thickness of 1.9 mm), vacuumizing is performed until the vacuum degree is less than $8\times10^{-4}$ Pa, argon gas is injected, the operation circulates 3 times, then vacuumizing is performed until the vacuum degree is less than $8\times10^{-4}$ Pa, and the outer flat-bottomed quartz tube is sealed with a flame, so that a double-layer quartz tube containing the mixture is obtained. The double-layer quartz tube is placed in an improved vertical tube furnace, and a distance between the bottom of the inner tapered-bottomed quartz tube and a heating thermocouple of the vertical tube furnace is 10.5 cm. A temperature control program of the heating thermocouple of the vertical tube furnace is set as: first heating to 1060° C. at a rate of 60° C./h, and maintaining for 1200 min; and then cooling to 680° C. at a rate of 0.6° C./h, and then cooling to 30° C. at a rate of 40° C./h. Finally, P-type SnSe crystal capable of being used as thermoelectric refrigeration material is obtained.

The obtained SnSe crystal is cut and polished into specific shapes for subsequent measurements and characterizations of thermoelectric performance parameters and assembly testing of single-leg and multi-pair thermoelectric refrigeration devices.

Embodiment 8

According to a molar ratio of Sn, Se, Pb and Na of 0.888:1:0.09:0.022, blocks of Sn, Se, Pb and Na with the purity greater than 99.95% are weighed and mixed in a glove box with an inert gas of nitrogen to obtain a mixture. The mixture is placed into an inner tapered-bottomed quartz tube (with a height of 12 cm, an inner diameter of 13 mm, a tube wall thickness of 1.4 mm, and a thickness of a carbon layer on an inner wall of 0.18 mm), vacuumizing is performed until the vacuum degree is less than $5\times10^{-4}$ Pa, argon gas is injected, the operation circulates 4 times, then vacuumizing is performed until the vacuum degree is less than $5\times10^{-4}$ Pa, and the quartz tube with a tapered bottom is sealed with a flame. The sealed inner quartz tube with the tapered bottom is placed in an outer flat-bottomed quartz tube with the inner diameter of 26 mm (with the tube wall thickness of 2 mm), vacuumizing is performed until the vacuum degree is less than $8\times10^{-4}$ Pa, argon gas is injected, the operation circulates 3 times, then vacuumizing is performed until the vacuum degree is less than $8\times10^{-4}$ Pa, and the outer flat-bottomed quartz tube is sealed with a flame, so that a double-layer quartz tube containing the mixture is obtained. The double-layer quartz tube is placed in an improved vertical tube furnace, and a distance between the bottom of the inner tapered-bottomed quartz tube and a heating thermocouple of the vertical tube furnace is 10 cm. A temperature control program of the heating thermocouple of the vertical tube furnace is set as: first heating to 1060° C. at a rate of 60° C./h, and maintaining for 1200 min; and then cooling to 680° C. at a rate of 0.6° C./h, and then cooling to 30° C. at a rate of 40° C./h. Finally, P-type SnSe crystal capable of being used as thermoelectric refrigeration material is obtained.

The obtained SnSe crystal is cut and polished into specific shapes for subsequent measurements and characterizations of thermoelectric performance parameters and assembly testing of single-leg and multi-pair thermoelectric refrigeration devices.

Embodiment 9

According to a molar ratio of Sn, Se, Pb and Na of 0.889:1:0.09:0.021, blocks of Sn, Se, Pb and Na with the purity greater than 99.95% are weighed and mixed in a glove box with an inert gas of nitrogen to obtain a mixture. The mixture is placed into an inner tapered-bottomed quartz tube (with a height of 12 cm, an inner diameter of 12 mm, a tube wall thickness of 1.5 mm, and a thickness of a carbon layer on an inner wall of 0.2 mm), vacuumizing is performed until the vacuum degree is less than $5\times10^{-4}$ Pa, argon gas is injected, the operation circulates 4 times, then vacuumizing is performed until the vacuum degree is less than $5\times10^{-4}$ Pa, and the quartz tube with a tapered bottom is sealed with a flame. The sealed inner quartz tube with the tapered bottom is placed in an outer flat-bottomed quartz tube with the inner diameter of 25 mm (with the tube wall thickness of 2 mm), vacuumizing is performed until the vacuum degree is less than $6\times10^{-4}$ Pa, argon gas is injected, the operation circulates 4 times, then vacuumizing is performed until the vacuum degree is less than $6\times10^{-4}$ Pa, and the outer flat-bottomed quartz tube is sealed with a flame, so that a double-layer quartz tube containing the mixture is obtained. The double-layer quartz tube is placed in an improved vertical tube furnace, and a distance between the bottom of the inner tapered-bottomed quartz tube and a heating thermocouple of the vertical tube furnace is 10 cm. A temperature control program of the heating thermocouple of the vertical tube furnace is set as: first heating to 1090° C. at a rate of 90° C./h, and maintaining for 1300 min; and then cooling to 690° C. at a rate of 0.9° C./h, and then cooling to 30° C. at a rate of 30° C./h. Finally, P-type SnSe crystal capable of being used as thermoelectric refrigeration material is obtained.

The obtained SnSe crystal is cut and polished into specific shapes for subsequent measurements and characterizations of thermoelectric performance parameters and assembly testing of single-leg and multi-pair thermoelectric refrigeration devices.

Embodiment 10

According to a molar ratio of Sn, Se, Pb and Na of 0.891:1:0.09:0.019, blocks of Sn, Se, Pb and Na with the purity greater than 99.95% are weighed and mixed in a glove box with an inert gas of nitrogen to obtain a mixture. The mixture is placed into an inner tapered-bottomed quartz tube (with a height of 12 cm, an inner diameter of 12.5 mm, a tube wall thickness of 1.5 mm, and a thickness of a carbon layer on an inner wall of 0.18 mm), vacuumizing is performed until the vacuum degree is less than $5\times10^{-4}$ Pa, argon gas is injected, the operation circulates 4 times, then vacuumizing is performed until the vacuum degree is less than $5\times10^{-4}$ Pa, and the quartz tube with a tapered bottom is sealed with a flame. The sealed inner quartz tube with the tapered bottom is placed in an outer flat-bottomed quartz tube with the inner diameter of 26 mm (with the tube wall thickness of 2 mm), vacuumizing is performed until the vacuum degree is less than $6\times10^{-4}$ Pa, argon gas is injected, the operation circulates 4 times, then vacuumizing is performed until the vacuum degree is less than $6\times10^{-4}$ Pa, and the outer flat-bottomed quartz tube is sealed with a flame, so that a double-layer quartz tube containing the mixture is obtained. The double-layer quartz tube is placed in an improved vertical tube furnace, and a distance between the bottom of the inner tapered-bottomed quartz tube and a heating thermocouple of the vertical tube furnace is 10.2 cm. A temperature control program of the heating thermocouple of the vertical tube furnace is set as: first heating to 1090° C. at a rate of 90° C./h, and maintaining for 1300 min; and then cooling to 690° C. at a rate of 0.9° C./h, and then cooling to 30° C. at a rate of 30° C./h. Finally, P-type SnSe crystal capable of being used as thermoelectric refrigeration material is obtained.

The obtained SnSe crystal is cut and polished into specific shapes for subsequent measurements and characterizations of thermoelectric performance parameters and assembly testing of single-leg and multi-pair thermoelectric refrigeration devices.

According to the P-type SnSe crystal obtained in the above embodiments, the crystal is peeled off along a cleavage plane, and the crystal is cut and polished along the b-axis direction in the crystal plane. Then, a Seebeck and resistivity measurement system and a laser thermal conductivity system are used to measure the obtained sample, and the power factor (PF) and thermoelectric performance figure of merit (ZT) of the crystal sample are obtained.

Figure 5:
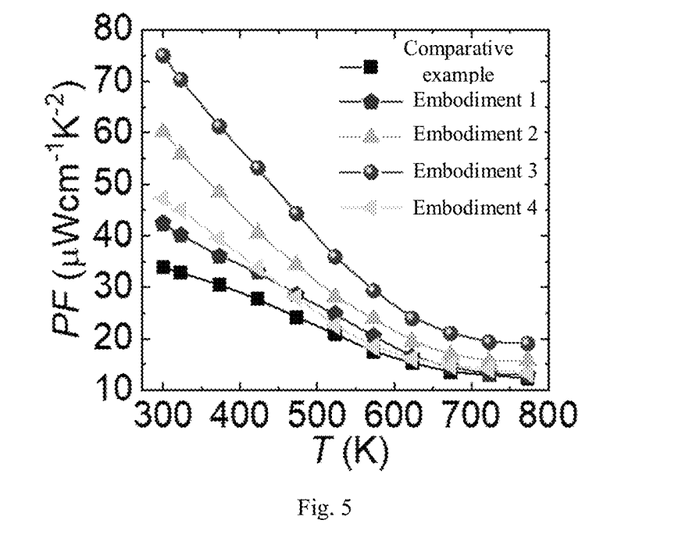
FIG. 5 is the measurement result data curve showing changes of the power factor (PF) of the P-type SnSe crystal with temperature (T/K) provided by Embodiments 1-4 of the present disclosure.
Figure 6:
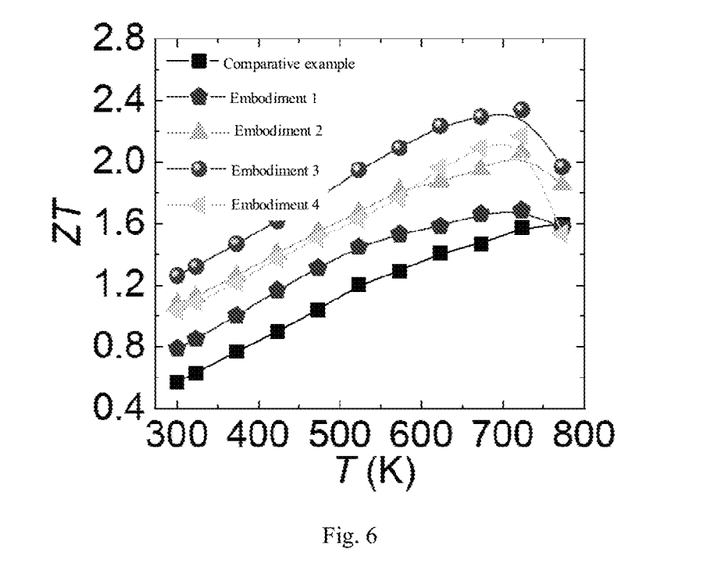
FIG. 6 is the measurement result data curve showing changes of the thermoelectric figure of merit (ZT) of the P-type SnSe crystal with temperature (T/K) provided by Embodiments 1-4 of the present disclosure.

FIG. 5 is the measurement result data showing changes of the power factor (PF) of the P-type SnSe crystal prepared in Embodiments 1-4 and a comparative example with temperature. FIG. 6 is the measurement result data showing changes of the thermoelectric performance figure of merit (ZT) of the P-type SnSe crystal prepared in Embodiments 1-4 and the comparative example with temperature. From FIGS. 5-6, it can be seen that in the Na-doped and Pb-alloyed P-type SnSe crystal provided by the present disclosure, the solid solution of Pb effectively changes the power factor of the material in the measurement temperature range, which indicates that the electrical performance of the sample has been greatly improved. This comes from the fact that Pb solid solution promotes the synergistic effect between the multiple valence bands of the P-type SnSe material, and simultaneously optimizes the carrier mobility and effective mass of the material, so the electrical conductivity and Seebeck coefficient of the material are synergistically improved, a higher power factor is obtained, and finally a greatly optimized thermoelectric figure of merit is obtained. Especially near room temperature, the thermoelectric figure of merit of the P-type SnSe crystal reaches about 1.2, which fully reflects its great potential as a novel thermoelectric refrigeration material.

Specific implementation of the comparative example may be:

According to a molar ratio of Sn, Se, Pb and Na of 0.95:1:0.03:0.02, blocks of Sn, Se, Pb and Na with the purity greater than 99.95% are weighed and mixed in a glove box with an inert gas of nitrogen to obtain a mixture. The mixture is placed into an inner tapered-bottomed quartz tube (with a height of 12 cm, an inner diameter of 12.5 mm, a tube wall thickness of 1.5 mm, and a thickness of a carbon layer on an inner wall of 0.18 mm), vacuumizing is performed until the vacuum degree is less than $8\times10^{-4}$ Pa, argon gas is injected, the operation circulates 4 times, then vacuumizing is performed until the vacuum degree is less than $8\times10^{-4}$ Pa, and the quartz tube with a tapered bottom is sealed with a flame. The sealed inner quartz tube with the tapered bottom is placed in an outer flat-bottomed quartz tube with the inner diameter of 26 mm (with the tube wall thickness of 2 mm), vacuumizing is performed until the vacuum degree is less than $1\times10^{-3}$ Pa, argon gas is injected, the operation circulates 3 times, then vacuumizing is performed until the vacuum degree is less than $1\times10^{-3}$ Pa, and the outer flat-bottomed quartz tube is sealed with a flame, so that a double-layer quartz tube containing the mixture is obtained. The double-layer quartz tube is placed in an improved vertical tube furnace, and a distance between the bottom of the inner tapered-bottomed quartz tube and a heating thermocouple of the vertical tube furnace is 10.5 cm. A temperature control program of the heating thermocouple of the vertical tube furnace is set as: first heating to 1080° C. at a rate of 80° C./h, and maintaining for 1200 min; and then cooling to 700° C. at a rate of 1° C./h, and then cooling to 30° C. at a rate of 40° C./h. Finally, P-type SnSe crystal capable of being used as thermoelectric refrigeration material is obtained. The obtained SnSe crystal is cut and polished into specific shapes for subsequent measurements and characterizations of thermoelectric performance parameters and assembly testing of single-leg and multi-pair thermoelectric refrigeration devices.

Figure 7:
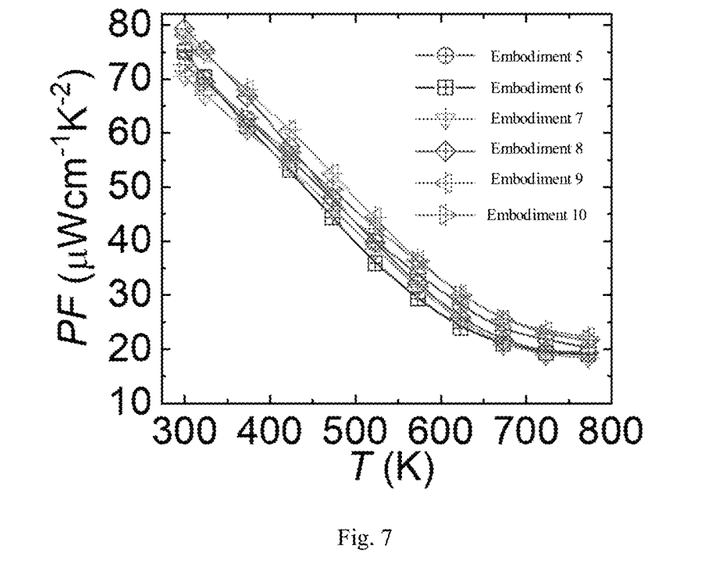
FIG. 7 is the measurement result data curve showing changes of the power factor (PF) of the P-type SnSe crystal with temperature (T/K) provided by Embodiments 5-10 of the present disclosure.
Figure 8:
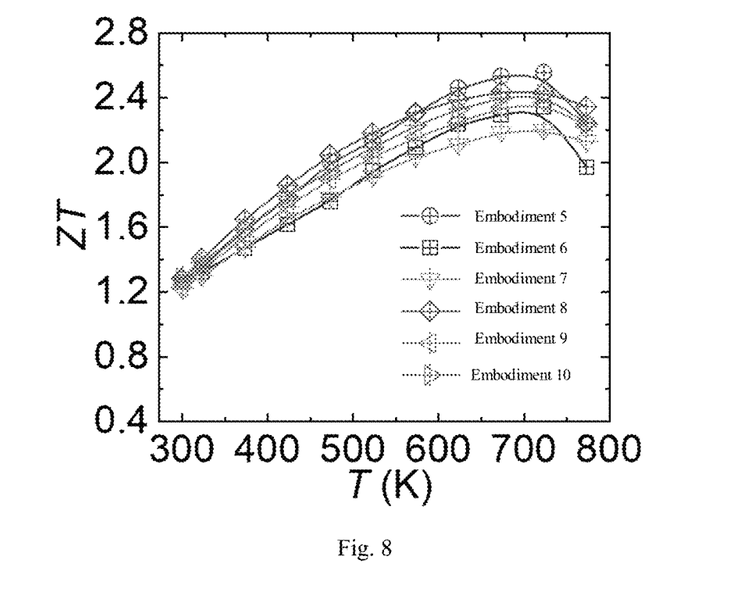
FIG. 8 is the measurement result data curve showing changes of the thermoelectric figure of merit (ZT) of the P-type SnSe crystal with temperature (T/K) provided by Embodiments 5-10 of the present disclosure.

FIG. 7 is the measurement result data showing changes of the power factor (PF) of the P-type SnSe crystal prepared in Embodiments 5-10 with temperature. FIG. 8 is the measurement result data showing changes of the thermoelectric figure of merit (ZT) of the P-type SnSe crystal prepared in Embodiments 5-10 with temperature. From FIGS. 7-8, it can be seen that the thermoelectric performance of the Na-doped and Pb-alloyed high-performance P-type SnSe crystal provided by the present disclosure has been significantly optimized throughout the measurement temperature range. For the high-performance P-type SnSe crystal prepared in Embodiments 5-10, the power factor at the room temperature is ≥70 $\mu Wcm^{-1}K^{-2}$, and ZT at the room temperature is ≥1.2. At the same time, curves showing changes of the PF and ZT with temperature in FIGS. 7-8 indicate that the high-performance P-type SnSe crystal prepared by the present disclosure can be repeatedly prepared in large quantities, and its thermoelectric performance is highly repeatable.

The thermoelectric transmission performance of the high-performance P-type SnSe crystal prepared in Embodiments 5-10 can be obtained from FIGS. 7-8, and is as shown in Table 1:

TABLE 1

| Embodiments 5-10 | Na doping content (x) | Pb solid solution content (y) | Whether to synthesize a P-type crystal | Power factor PF($\mu Wcm^{-1}K^{-2}$) at a room temperature | ZT at a room temperature |
|---|---|---|---|---|---|
| 5 | 0.015 | 0.09 | yes | 75.4 | 1.28 |
| 6 | 0.025 | 0.09 | yes | 75.1 | 1.26 |
| 7 | 0.018 | 0.09 | yes | 70.0 | 1.20 |
| 8 | 0.022 | 0.09 | yes | 79.3 | 1.28 |
| 9 | 0.021 | 0.09 | yes | 78.1 | 1.23 |
| 10 | 0.019 | 0.09 | yes | 72.7 | 1.29 |

It can be seen from the above embodiments and comparative examples that the P-type SnSe crystal provided by the present disclosure has excellent thermoelectric transmission performance, at the same time, the obtained high-performance P-type SnSe crystal can be repeatedly prepared in large quantities, and its thermoelectric performance is highly repeatable.

On the basis of obtaining the above high-performance P-type SnSe crystal by the present disclosure, it is considered that the existing thermoelectric performance, especially thermoelectric performance at the room temperature (PF≥70 $\mu Wcm^{-1}K^{-2}$ and ZT≥1.2), make the P-type SnSe crystal have great potential to become a novel thermoelectric refrigeration material. Therefore, the obtained high-performance P-type SnSe crystal was cut and polished, and a single-leg refrigeration temperature difference measurement was performed in order to verify that the P-type SnSe crystal has certain thermoelectric refrigeration capacity.

By building the single-leg thermoelectric material refrigeration temperature difference measurement platform, the obtained high-performance P-type SnSe crystal is processed and then placed at a corresponding sample position of the platform, and a power-on test is performed. After the temperatures of cold and hot ends are stable, a thermocouple temperature difference value of the cold and hot ends can be read, so a curve showing changes of the maximum temperature difference (ΔTmax) of single-leg refrigeration with input current (I/A) can be obtained. The measurement result is as shown in FIG. 2. The data curve shows that at a current of 2 A, the single-leg high-performance P-type SnSe crystal provided by the present disclosure may stably realize a refrigeration temperature difference of 17.6 K.

Therefore, based on the high-performance P-type SnSe crystal provided by the present disclosure, the refrigeration performance of its single-leg thermoelectric device has been measured and characterized, which indicates that the P-type SnSe crystal prepared by the present disclosure may be used as an important novel thermoelectric refrigeration material. At the same time, the novel thermoelectric refrigeration material based on the P-type SnSe crystal provided by the present disclosure has the advantages of environmentally friendly, earth-abundant reserves, low price, and lighter mass compared with traditional commercial bismuth telluride refrigeration material, reflecting its great industrial economic advantages and social benefits in practical applications.

The embodiments of the present disclosure are described in detail above, and specific examples are used herein to illustrate the principle and implementation of the present disclosure. The descriptions of the above embodiments are only used to help understand the core idea of the present disclosure. At the same time, those skilled in the art will appreciate that various changes can be made in the specific implementation and scope of application in light of the idea of the present disclosure.

What is claimed is:

1. A preparation method of P-type SnSe crystal capable of being used as thermoelectric refrigeration material, comprising:
   step 1, mixing Sn, Se, Pb and Na according to a molar ratio of (1-x-y):1:y:x to obtain a mixture, where: 0.015≤x≤0.025 and 0.05≤y≤0.11;
   step 2, performing a high-temperature melting synthesis reaction on the mixture; and
   step 3, cooling and growing the composition subjected to the reaction in step 2 to obtain the P-type SnSe crystal, wherein the crystal is capable of being used as the thermoelectric refrigeration material.

2. The preparation method of the P-type SnSe crystal capable of being used as the thermoelectric refrigeration material according to claim 1, wherein step 2 specifically comprises:
   placing the mixture in a quartz tube, and performing vacuumizing treatment, wherein a vacuum degree is less than or equal to 1×10⁻³ Pa; and
   vertically placing the quartz tube containing the mixture in a high-temperature furnace for the high-temperature melting synthesis reaction.

3. The preparation method of the P-type SnSe crystal capable of being used as the thermoelectric refrigeration material according to claim 2, wherein conditions of the high-temperature melting synthesis reaction comprise: first increasing a temperature of the high-temperature furnace to 1050-1100° C. at a rate of 50-100° C./h, and maintaining the temperature for 1000-1500 min for the high-temperature melting synthesis reaction.

4. The preparation method of the P-type SnSe crystal capable of being used as the thermoelectric refrigeration material according to claim 2, wherein the quartz tube is of a double-layer structure, and comprises an inner quartz tube configured to contain the mixture and an outer quartz tube, the inner quartz tube is a tapered-bottomed quartz tube with a tube wall thickness of not less than 1 mm, and the outer quartz tube is a flat-bottomed quartz tube with a tube wall thickness of not less than 1.5 mm.

5. The preparation method of the P-type SnSe crystal capable of being used as the thermoelectric refrigeration material according to claim 3, wherein the quartz tube is of a double-layer structure, and comprises an inner quartz tube configured to contain the mixture and an outer quartz tube, the inner quartz tube is a tapered-bottomed quartz tube with a tube wall thickness of not less than 1 mm, and the outer quartz tube is a flat-bottomed quartz tube with a tube wall thickness of not less than 1.5 mm.

6. The preparation method of the P-type SnSe crystal capable of being used as the thermoelectric refrigeration material according to claim 4, wherein an angle θ of a bottom taper of the inner quartz tube is $15° \leq \theta/2 \leq 25°$.

7. The preparation method of the P-type SnSe crystal capable of being used as the thermoelectric refrigeration material according to claim 5, wherein an angle θ of a bottom taper of the inner quartz tube is $15° \leq \theta/2 \leq 25°$.

8. The preparation method of the P-type SnSe crystal capable of being used as the thermoelectric refrigeration material according to claim 4, wherein a diameter difference between an inner wall diameter of the outer quartz tube and an outer wall diameter of the inner quartz tube is not less than 5 mm.

9. The preparation method of the P-type SnSe crystal capable of being used as the thermoelectric refrigeration material according to claim 5, wherein a diameter difference between an inner wall diameter of the outer quartz tube and an outer wall diameter of the inner quartz tube is not less than 5 mm.

10. The preparation method of the P-type SnSe crystal capable of being used as the thermoelectric refrigeration material according to claim 4, wherein a distance between a heating thermocouple of the high-temperature furnace and a bottom of the inner quartz tube is 9-11 cm.

11. The preparation method of the P-type SnSe crystal capable of being used as the thermoelectric refrigeration material according to claim 5, wherein a distance between a heating thermocouple of the high-temperature furnace and a bottom of the inner quartz tube is 9-11 cm.

12. The preparation method of the P-type SnSe crystal capable of being used as the thermoelectric refrigeration material according to claim 4, wherein an inner wall of the inner quartz tube is coated with a carbon layer for protection, and a thickness of the carbon layer is not less than 0.1 mm.

13. The preparation method of the P-type SnSe crystal capable of being used as the thermoelectric refrigeration material according to claim 5, wherein an inner wall of the inner quartz tube is coated with a carbon layer for protection, and a thickness of the carbon layer is not less than 0.1 mm.

14. The preparation method of the P-type SnSe crystal capable of being used as the thermoelectric refrigeration material according to claim 1, wherein step 3 specifically comprises:
    decreasing the temperature of the high-temperature furnace to 650-700° C. at a rate of 0.5-1° C./h for crystal growth; and
    then decreasing the temperature of the high-temperature furnace to 20-30° C. at a rate of 20-50° C./h to obtain the P-type SnSe crystal capable of being used as the thermoelectric refrigeration material.

15. The preparation method of the P-type SnSe crystal capable of being used as the thermoelectric refrigeration material according to claim 4, wherein step 3 specifically comprises:
    decreasing the temperature of the high-temperature furnace to 650-700° C. at a rate of 0.5-1° C./h for crystal growth; and
    then decreasing the temperature of the high-temperature furnace to 20-30 C. at a rate of 20-50° C./h to obtain the P-type SnSe crystal capable of being used as the thermoelectric refrigeration material.

16. The preparation method of the P-type SnSe crystal capable of being used as the thermoelectric refrigeration material according to claim 5, wherein step 3 specifically comprises:
    decreasing the temperature of the high-temperature furnace to 650-700° C. at a rate of 0.5-1° C./h for crystal growth; and
    then decreasing the temperature of the high-temperature furnace to 20-30° C. at a rate of 20-50° C./h to obtain the P-type SnSe crystal capable of being used as the thermoelectric refrigeration material.

\* \* \* \* \*